(12) United States Patent
Edwards et al.

(10) Patent No.: US 9,397,082 B2
(45) Date of Patent: Jul. 19, 2016

(54) MULTIPLE DIE LEAD FRAME PACKAGING

(71) Applicants: William E. Edwards, Ann Arbor, MI (US); Gary C. Johnson, Tempe, AZ (US)

(72) Inventors: William E. Edwards, Ann Arbor, MI (US); Gary C. Johnson, Tempe, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/990,468

(22) Filed: Jan. 7, 2016

(65) Prior Publication Data

US 2016/0118373 A1  Apr. 28, 2016

Related U.S. Application Data

(62) Division of application No. 14/189,609, filed on Feb. 25, 2014, now Pat. No. 9,236,331.

(51) Int. Cl.
*H01L 21/44* (2006.01)
*H01L 25/00* (2006.01)
*H01L 21/48* (2006.01)
*H01L 21/56* (2006.01)

(52) U.S. Cl.
CPC ............ *H01L 25/50* (2013.01); *H01L 21/4825* (2013.01); *H01L 21/4842* (2013.01); *H01L 21/565* (2013.01)

(58) Field of Classification Search
CPC ........... H01L 2924/01078; H01L 2924/01079; H01L 2924/01029; H01L 2924/01013; H01L 2924/14; H01L 24/49; H01L 24/85; H01L 24/142; H01L 24/386; H01L 2224/16225; H01L 2224/3225; H01L 2224/73265; H01L 2224/48091; H01L 2224/48227; H01L 2224/73204; H01L 2224/32145; H01L 25/18; H01L 25/105; H01L 25/0657
USPC ......... 438/107–108, 612, 617, 614, 118, 106, 438/109
See application file for complete search history.

(56) References Cited

U.S. PATENT DOCUMENTS

| | | | |
|---|---|---|---|
| 5,918,112 A | 6/1999 | Shah et al. | |
| 7,629,675 B2 | 12/2009 | Briggs et al. | |
| 2011/0169144 A1 | 7/2011 | Moreno | |
| 2015/0035129 A1* | 2/2015 | Zhang | H01L 23/49534 257/675 |

* cited by examiner

*Primary Examiner* — Hoa B Trinh

(57) ABSTRACT

First and second semiconductor die are mounted to first and second die pads of a lead frame disposed in a lead frame sheet. With a plurality of wire bonds, each post of a plurality of posts of the lead frame is connected to the first and second semiconductor die. Each post extends inward from opposite sides of the lead frame between the first and second die pads and is connected with a respective one of a plurality of leads of the lead frame. The first and second semiconductor die, the plurality of posts of the lead frame, and the plurality of wire bonds are encapsulated in a package. The lead frame sheet is sheared to define each lead of the plurality of leads. The plurality of posts includes first and second sets of posts extending inward from first and second opposite sides of the lead frame.

20 Claims, 2 Drawing Sheets

MULTIPLE DIE LEAD FRAME PACKAGING

CROSS-REFERENCE TO RELATED APPLICATION

This application is a divisional application of U.S. application Ser. No. 14/189,609, entitled "Multiple Die Lead Frame" and filed Feb. 25, 2014, the entire disclosure of which is hereby incorporated by reference.

FIELD OF INVENTION

The present embodiments relate to semiconductor devices.

BACKGROUND

Integrated circuit (IC) chips and other semiconductor devices are often packaged using lead frames. Lead frames include a number of metal leads (or pins) that extend outward from an enclosure in which a semiconductor die (or chip) is disposed. Deployment of the semiconductor device often involves soldering the pins to a printed circuit board.

Wire bonds are typically used to establish electrical connections between the pins and the semiconductor die. In wire bonding, bond wires are attached to bond pads located on the semiconductor die. The bond wires generally do not overlap. In this manner, short circuits may be avoided.

Lead frame packaging is complicated by disposition of multiple die in the same package. One complication involves the presence of die-to-die wires, which may increase the likelihood of wire crossings and short circuits. Other complications involve the inefficient allocation of pins. For example, the multiple die may have a number of pins in common. For example, ground and power supply pins may be duplicated across the multiple die.

The number of duplicative pins may increase substantially in multiple die packages in which the multiple die are identical or similar. Such duplication may lead to artificially high pin counts. For these and other reasons, the resulting package may be excessively or undesirably large.

Attempts to address the multiple die complications may present other issues. One approach involves mounting the multiple die on a common substrate. But such substrate packages unfortunately often introduce thermal limitations. For instance, the substrate typically impedes heat dissipation.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
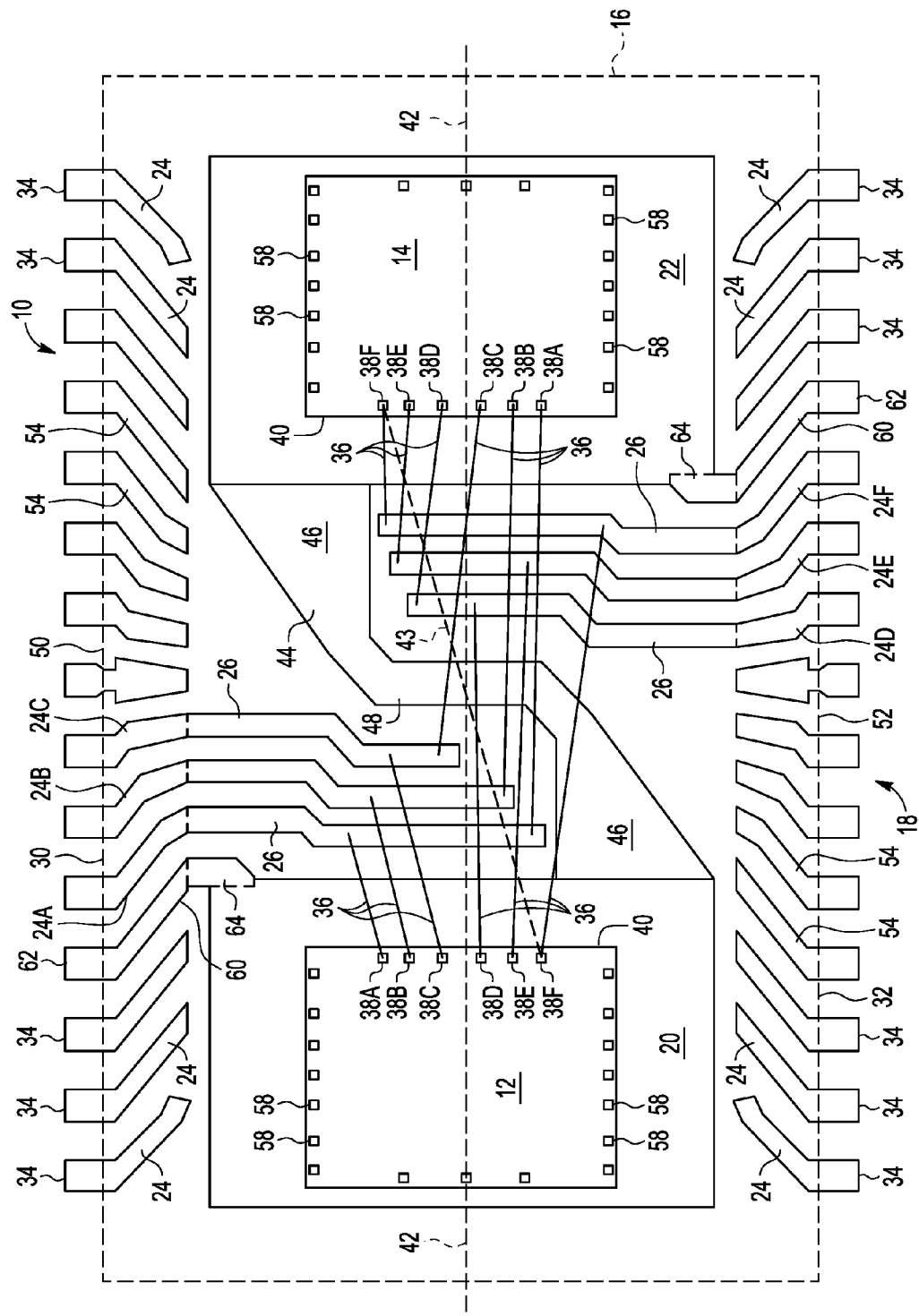
FIG. 1 is a schematic, plan view of an exemplary semiconductor device having a multiple die packaging arrangement in accordance with one embodiment.

Semiconductor devices and electronic apparatus having package lead sharing among multiple die are described. The devices and apparatus may be packaged with lead frames configured to establish common connections between multiple die. Each shared or common connection is made to a respective package pin. The pin count of the semiconductor device or electronic apparatus may thus decrease. The connections may be established via a segmented or notched flag (or die pad) of the lead frame. The segmentation of the flag may define multiple, spaced apart die pads on which the multiple die are respectively disposed. The segmentation allows a number of packaging posts to extend inward between the die pads for the shared connections.

The packaging posts, or post extensions, act as interconnects to allow the multiple die to establish multiple connections to a single pin or lead. Each packaging post may be connected with a respective lead (or pin) of the lead frame. Each packaging post may extend inward between the die pads to an extent that allows the multiple die to be connected without overlaps in the connections. For example, the packaging posts may extend inward from the pins past a midline or center line of the die or of the die pads. Extension past the midline allows the connections to be made without bond wire overlaps or crossings.

The die pads may be supported in one or more ways. In some embodiments, the lead frame includes a connecting bar that connects the die pads to one another. The connecting bar may be oriented diagonally between the die pads and/or be shaped to allow the packaging posts to extend between the die pads. For example, the connecting bar may have a serpentine or other shape. Alternatively or additionally, the lead frame includes one or more tie bars to connect each die pad to one or more package pins. The connecting bar and/or the tie bars may be configured to maintain or facilitate flag rigidity during assembly. The connecting bar and/or the tie bars may alternatively or additionally be used for electrical connectivity, such as electrical connectivity between the die pads. The connecting bar and/or tie bars are not limited to purposes related to mechanical or structural support.

The packaging may be over-molded integrated circuit (IC) packaging. Other packaging techniques, materials, components, and processes may be used. Furthermore, the configuration of the lead frame packaging may vary. For example, the lead frame packaging may be configured for surface mounting with peripheral leads, as in quad flat pack (QFP) packages, low profile QFD (LQFD) packages, and thin QFD (TQFD) packages. Although described below in connection with peripheral leads, the disclosed embodiments may be used with other types of lead frame packages. For example, the disclosed embodiments may be used with lead pads located on a bottom surface of the package, as in, for instance, quad flat no-lead (QFN) packages. Other package types, aspects, or features may be provided, including, for instance, small outline integrated circuit (SOIC) packages.

Although described below in connection with die having identical layouts, the disclosed embodiments are not limited to any particular die type, layout, configuration, substrate, size, aspect ratio, or other feature or characteristic. For example, the multiple die may have layouts that differ to any desired extent. The number of shared or common pins may thus vary considerably.

The positioning, orientation, and other aspects of the placement of the die on the die pads may also vary. For instance, each die pad may support more than one die. The manner in which the die are mounted or secured to the die pads may also vary.

Although the disclosed embodiments are especially useful in connection with electronic apparatus in which multiple die are used to provide multiple signal or data channels, the disclosed embodiments may be used in a wide variety of system-in-package (SiP) and other applications. The disclosed embodiments may be used to allow different types of IC chips to be enclosed in a common package to provide system-level functionality.

FIG. 1 depicts an electronic apparatus 10 or semiconductor device in accordance with one embodiment. The electronic apparatus 10 includes a pair of semiconductor die 12, 14 disposed within a packaging enclosure 16. Additional semiconductor die may be included. For example, four die may be arranged as two die pairs spaced from one another within the packaging enclosure 16. The packaging enclosure 16 is shown in phantom for ease of illustration of other elements of the electronic apparatus 10 disposed within the packaging enclosure 16. The packaging enclosure 16 may be a molded enclosure. Other types of enclosures may be used. For instance, the packaging enclosure 16 may not use overmolded material to cover the semiconductor die 12, 14. In one example, the semiconductor die 12, 14 may be covered with a silicone or other gel within a metal or other lid or enclosure. Such enclosures may be useful in connection with, for instance, pressure sensors.

Each semiconductor die 12, 14 includes one or more circuits disposed on and/or within a substrate. The substrate may include one or more semiconductor materials and/or layers. Any semiconductor materials may be included. The semiconductor die 12, 14 may include a wide variety of different transistor devices. For example, the semiconductor die 12, 14 may include field effect transistor (FET) devices and/or bipolar junction transistor (BJT) devices. The transistor devices may be configured as logic devices, power devices, and/or RF devices. The nature of the circuits on the semiconductor die 12, 14 may vary considerably.

The electronic apparatus 10 includes a lead frame 18 to establish electrical connections with the semiconductor die 12, 14. The lead frame 18 includes a pair of die pads 20, 22 (or flags) disposed within the packaging enclosure 16. The die pads 20, 22 and/or other components of the lead frame 18 may provide structural support for the semiconductor die 12, 14 during assembly or packaging. The semiconductor die 12, 14 are mounted or otherwise disposed on the die pads 20, 22, respectively.

The die pads 20, 22 may be considered portions of a single, segmented die pad from which sections are notched out or otherwise removed. For example, the die pads 20, 22 and/or other portions of the lead frame 18 may be formed by stamping, etching, or otherwise shaping a lead frame sheet. The die pads 20, 22 and other portions of the lead frame 18 may thus be integrally formed to any desired extent.

The lead frame 18 also includes a plurality of packaging leads 24 projecting outward from the packaging enclosure 16. The packaging leads 24 are disposed along a periphery of the packaging enclosure 16. In this example, the packaging leads 24 are disposed along a pair of opposing sides 30, 32 of the packaging enclosure 16. The packaging leads 24 may be disposed on fewer, additional, or alternative sides. For example, the packaging leads 24 may be disposed along all four sides. Each packaging lead 24 includes a pin 34 that projects outward from the packaging enclosure 16. The pin 24 may be configured for electrical connectivity to, for instance, a printed circuit board (PCB) or other board or platform to which the electronic apparatus 10 is mounted for operation.

The lead frame 18 also includes a plurality of packaging posts 26 disposed within the packaging enclosure 18. Each packaging post 26 extends from a respective one of the packaging leads 24. As shown in FIG. 1, the packaging posts 26 extend inward from opposite sides of the lead frame 18 (and eventually the packaging enclosure). Any number of packaging posts 26 may extend from each side. The number of packaging posts 26 extending from each side may not be equal, as in the example of FIG. 1. Each packaging post 26 extends inward from a respective one of the packaging leads 24 between the first and second die pads 20, 22. Each packaging post 26 may be configured as a lead or post extension. For example, each packaging post 26 may have an elongate shape. The packaging posts 26 extending from a respective side of the packaging enclosure 18 may be disposed in parallel, or roughly in parallel.

The packaging posts 26 are configured as interconnects for wire bonding the semiconductor die 12, 14 to the packaging leads 24. A number of wire bonds 36 are disposed within the packaging enclosure 16. Each of the first and second semiconductor die 12, 14 includes a respective set of bond pads 38A-38F to which the wire bonds 36 are connected. The bond pads 38A-38F may be disposed along an inward facing side 40 of each semiconductor die 12, 14. The sides 40 are inward facing such that the sides 40 oppose one another as shown in FIG. 1. Each wire bond 36 electrically connects a respective one of the bond pads 38A-38F along the side 40 with one of the packaging posts 26.

The packaging posts 26 are configured to allow the semiconductor die 12, 14 to share the packaging leads 24 from which the packaging posts 26 extend. Each packaging post 26 is connected via a respective pair of the plurality of wire bonds 36 to one pair of the bond pads 38A-38F on the semiconductor die 12, 14. In this example, the bond pads 38A on each semiconductor die 12, 14 are connected to a respective one of the packaging posts 26. Similarly, the bond pads 38B on each semiconductor die 12, 14 are connected to another respective one of the packaging posts 26, and so on for each of the bond pads 38C-38F.

In the embodiment of FIG. 1, the positioning, dimensions, and arrangement of the packaging posts 26 supports the sharing of the packaging leads 24. For instance, the packaging posts 26 are disposed and extend along the inward facing sides 40 of the semiconductor die 12, 14. The extension of each packaging post 26 between the die pads 20, 22 provides space for the wire bond connections to both of the semiconductor die 12, 14. For example, each packaging post 26 may extend beyond a midpoint or midline 42 to accommodate the wire bond connections. Such extension allows the wire bonds 36 to avoid having to cross one another. In the embodiment of FIG. 1, and other embodiments having identical semiconductor die rotated 180 degrees relative to one another, each packaging post 26 extends laterally across a line that intersects the bond pads to which the packaging post 26 is connected. For example, the packaging post 26 for the bond pads 38F crosses a diagonal line 43. The respective lengths of the packaging posts 26 may thus vary based on the bond pads to which each packaging post 26 is connected. In some embodiments, the packaging posts 26 may not extend across the midline 42. The respective lengths of the packaging posts 26 may otherwise vary to accommodate the wire bonds to provide connections between both of the semiconductor die 12, 14 and shared packaging leads 24 via the packaging posts 26 without wire crossing and, thus, risk of short circuit. For example, the length of the packaging posts 26 may not extend across a midline or other line in embodiments in which the semiconductor die 12, 14 do not have identical layouts.

Further aspects of the lead frame 18 may enable the sharing of the packaging leads 24. In the embodiment of FIG. 1, the lead frame 18 further includes a connecting bar 44 that extends diagonally across the midline 42 between the die pads 20, 22 to connect the die pads 20, 22 to one another. The connecting bar 44 may provide structural support for the die pads 20, 22 during the mounting of the semiconductor die 12, 14. The shape or configuration of the connecting bar 44 allows the packaging posts 26 to extend inward as described above. For example, the connecting bar 44 may have a serpentine shape as shown. The connecting bar 44 may also have a width at any point along its length between the die pads 20, 22 selected to accommodate the positioning and extension of the packaging posts 26. For example, the connecting bar 44 may have a pair of end portions 46 that have a width less than half the length of the side 40 of the die pad 20, 22. The packaging posts 26 may extend beyond the midline 42 as a result of that width. The connecting bar 44 may also neck down or narrow to a central portion 48 oriented in parallel with the packaging posts 26. The central portion 48 may have a narrower width than the end portions 46 to maximize the space remaining for the packaging posts 26.

Other shapes may be used for the connecting bar 44. For example, the connecting bar 44 may have a uniform width along its entire length. A uniform or other varying width may be useful in connection with allowing additional inward extension of the packaging posts 26.

The midline 42 may be defined relative to the packaging enclosure 16, any component of the lead frame 18, and/or the semiconductor die 12, 14. For example, the packaging leads 24 shown in FIG. 1 are disposed along opposite sides 50, 52 of the packaging enclosure 16. The midline 42 may be defined as the line that extends laterally half way between the sides 50, 52, bisecting the packaging enclosure 16. Alternatively or additionally, the midline 42 may be defined as the line that bisects each of the die pads 20, 22. In some embodiments, the semiconductor die 12, 14 are laterally centered on the die pads 20, 22 and/or between the sides 50, 52. The midline 42 may thus be defined as the line that bisects each of the semiconductor die 12, 14.

The semiconductor die 12, 14 may have identical layouts. For example, the semiconductor die 12, 14 may be identical die. With identical layouts, the first and second semiconductor die 12, 14 may be rotated, or oriented 180 degrees, relative to one another such that the same bond pads 38A-38F are disposed along the inward facing side 40 of each semiconductor die 12, 14. The rotated orientation of the semiconductor die 12, 14 also inverts the positions of the bond pads 38A-38F along the sides 40. As shown in FIG. 1, for example, the bond pad 38A on the semiconductor die 12 is nearest the packaging side 50, while on the semiconductor die 14 the bond pad 38A is nearest the opposite packaging side 52. The order of the bond pads 38A-38F along the side 40 of the semiconductor die 12, 14 is thus inverted. This inversion in bond pad positions allows the wire bond connections to reach the packaging posts 26 without crossing one another.

The semiconductor die 12, 14 may be configured such that the bond pads 38A-38F are associated with electrical connections common thereto. For example, the bond pads 38A may be connected to a packaging lead 24A configured to establish a shared ground for the semiconductor die 12, 14. The bond pads 38B may be connected to a packaging lead 24B configured to establish a shared power supply for the semiconductor die 12, 14. The bond pads 38C may be connected to a packaging lead 24C configured to establish some other reference voltage or signal for the semiconductor die 12, 14.

The packaging leads 24 shared by the semiconductor die 12, 14 are not limited to pins that provide reference or power supply voltages. For example, the bond pads 38D-38F may be connected to packaging leads 24D-24F, respectively, to establish a number of shared serial parallel interfaces for the semiconductor die 12, 14. The packaging posts 26 may be used to establish any shared connection for the semiconductor die 12, 14.

In other embodiments, the semiconductor die 12, 14 may have similar, but non-identical, layouts. For example, the semiconductor die 12, 14 may have certain bond pads (e.g., power, ground, etc.) disposed and arranged along the inward facing side 40 so that the shared connections may be established. In some embodiments, the shared connections involve bond pads not disposed along the inward facing side 40 of the semiconductor die 12, 14.

The electronic apparatus 10 may have any number of packaging leads 24 and packaging posts 26. The number of packaging leads 24 may exceed the number of packaging posts 26 as shown. In this example, three packaging posts 26 extend from each row of packaging leads 24, for a total of six shared lead connections. Fewer, additional, or alternative packaging posts 26 may be included.

The packaging leads 24 of the electronic apparatus 10 may include any number of unshared leads 54. The unshared leads 54 may be provided for electrical connection with a number of further bond pads 58 on the semiconductor die 12, 14. For example, the bond pads 58 may be disposed along a side of the semiconductor die 12, 14 other than the inward facing side 40. The bond pads 58 are then connected via wire bonding to the unshared leads 54 without one of the packaging posts 26 serving as an interconnect. Other than the lack of an interconnect or packaging post, the unshared leads 54 may be similarly configured to the packaging leads 24A-24F.

The packaging leads 24 may also include further unshared packaging leads 60 connected to the die pads 20, 22. The unshared leads 60 may extend inward from an outer pin 62 to engage one of the die pads 20, 22. In the embodiment of FIG. 1, the unshared leads 60 include a tie bar 64 that extends inward to engage and connect to a respective one of the die pads 20, 22. One or more of the unshared leads 60 may thus provide structural support for the die pads 20, 22. The unshared leads 60 may or may not carry a voltage or signal. In the former case, one or both of the semiconductor die 12, 14 may include one or more signal bumps on a back side of the semiconductor substrate thereof for electrical connection with the die pad 20, 22.

The above-described components of the lead frame 18 may be integrally formed. For example, the lead frame 18 may be formed from a sheet of copper and/or other metal. A number of sections of the sheet are stamped out, etched, or otherwise removed to define the above-described features of the lead frame 18. The features are shown and described as separate components for ease in description and illustration.

Figure 2:
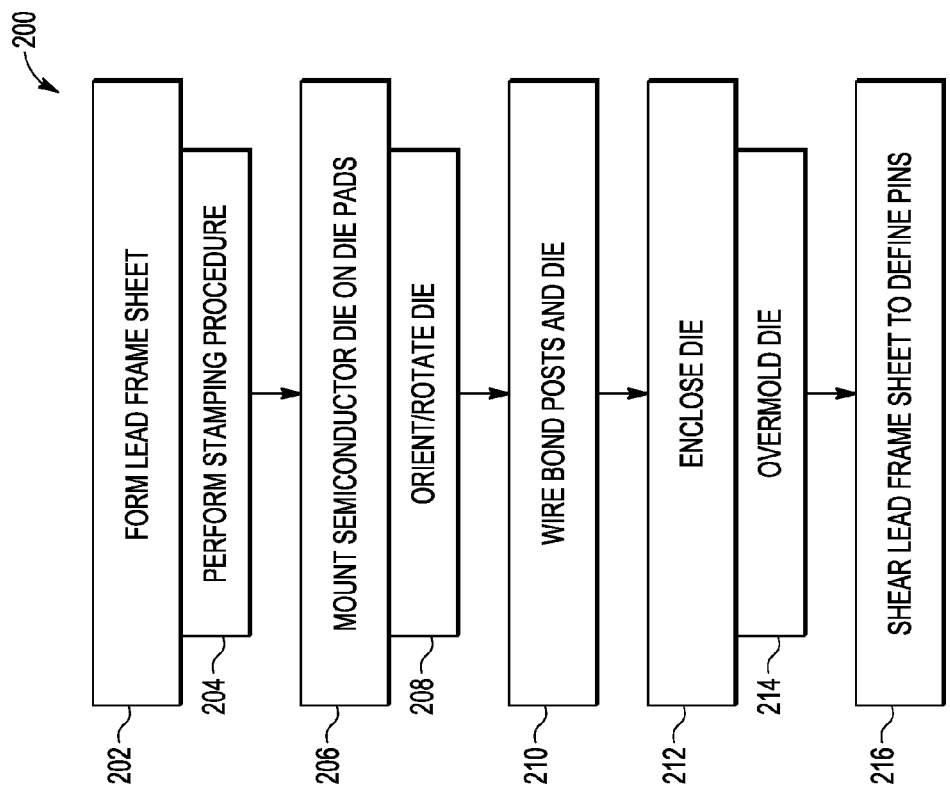
FIG. 2 is a flow diagram of an exemplary method of packaging a semiconductor device having a multiple die packaging arrangement in accordance with one embodiment.

FIG. 2 shows an exemplary fabrication method 200 for packaging a semiconductor device having multiple semiconductor die sharing one or more leads as described above. The method includes a sequence of acts or steps, only the salient of which are depicted for convenience in illustration. For example, the method may begin a number of acts or steps directed to the fabrication of one or more integrated circuits on one or more semiconductor substrates. Each semiconductor substrate is diced to form the multiple semiconductor die to be packaged in accordance with the fabrication method. The ordering of the acts may vary in other embodiments. For example, the semiconductor die may be mounted on the die pads before one or more portions or features of the lead frame sheet are defined.

The method 200 may begin with, or include, the formation of a lead frame sheet in act 202. The lead frame sheet may include one or more layers of metal. For example, the lead frame sheet may include a copper layer or sheet. The act 202 may include act 204 in which a stamping or etching procedure is performed to selectively remove portions of the copper layer or sheet. Such removal may define one or more lead frames configured as described above. Alternatively or additionally, the copper layer or sheet may be etched to define the lead frames. The etching procedure may include the patterning of an etch stop or block layer in accordance with one or more lead frames of the lead frame sheet.

In act 206, each semiconductor die is mounted on a respective die pad of the lead frame. For example, a pair of semiconductor die may be mounted on a pair of die pads, respectively, of a lead frame presented by the lead frame sheet. The mounting of the semiconductor die may include any desired attachment procedure. For example, adhesive-based or eutectic attachment techniques may be used.

The act 206 may include reorienting one or both of the semiconductor die in act 208. The semiconductor die may be reoriented or rotated to position certain bond pads of the semiconductor die along an inward facing side of the semiconductor die and, thus, the die pads. The bond pads may correspond with those bond pads for which the semiconductor die may share a packaging lead.

As described above, the semiconductor die may have identical layouts. In such cases, the reorientation of the semiconductor die may include rotating the semiconductor die 180 degrees relative to one another.

In act 210, a plurality of posts of the lead frame are connected, with a plurality of wire bonds, to the semiconductor die. Each post extends between the die pads on which the semiconductor die are mounted. Each post is an extension of, or otherwise connected with, a respective one of the leads of the lead frame. As described above, the configuration of the posts allows each post to be connected to both of the semiconductor die without crossing the wire bonds. For example, the post may be defined by the stamping (or other lead frame formation) procedure such that each post extends across a midline that bisects the semiconductor die. The semiconductor die may thus share the lead (or package pin) electrically connected to the post. The configuration of the posts and other features of the lead frame may be defined in the act 202 and/or the act 204. For example, the stamping procedure of the act 204 may be configured to define a serpentine connecting bar of the lead frame that extends across the midline to connect the first and second die pads to one another.

The semiconductor die, posts, and other packaging components (e.g., the wire bonds) may then be enclosed or otherwise encapsulated in a packaging enclosure or other package in act 212. In some embodiments, the packaging enclosure of act 212 includes an overmolding procedure performed in act 214. A variety of overmold materials and procedures may be used. For example, a silicone gel may be used to cover the wirebonded die in a cavity package.

The lead frame sheet may then be sheared in act 216 to separate the semiconductor device from the remainder of the lead frame sheet. The shearing may be configured to define each lead (or packaging pin) of the lead frame. The leads may include any number of shared leads and any number of unshared leads as described above. The leads may be disposed on any number of sides of the package enclosure.

Additional acts may be implemented at various points during the fabrication procedure. For example, one or more acts may be directed to establishing a heat sink for the semiconductor device. The procedures may be implemented in various orders. Additional or alternative procedures may be implemented.

In a first aspect, an electronic apparatus includes a packaging enclosure, first and second die pads disposed within the packaging enclosure, first and second semiconductor die disposed on the first and second die pads, respectively, a plurality of packaging leads, each packaging lead projecting outward from the packaging enclosure, a plurality of packaging posts disposed within the packaging enclosure and extending inward between the first and second die pads, each packaging post being connected with a respective one of the plurality of packaging leads, and a plurality of wire bonds disposed within the packaging enclosure. Each packaging post of the plurality of packaging posts is connected via a first respective wire bond of the plurality of wire bonds to the first semiconductor die and via a second respective wire bond of the plurality of wire bonds to the second semiconductor die. The plurality of packaging posts includes first and second sets of packaging posts extending inward from first and second opposite sides of the packaging enclosure, respectively.

In a second aspect, an electronic apparatus includes a packaging enclosure, first and second semiconductor die disposed within the packaging enclosure, and a lead frame. The lead frame includes first and second die pads disposed within the packaging enclosure and on which the first and second semiconductor die are disposed, respectively, a plurality of pins projecting outward from the packaging enclosure, and a plurality of interconnects disposed within the packaging enclosure and extending inward between the first and second die pads, each interconnect being connected with a respective one of the plurality of pins. The electronic apparatus further includes a plurality of wire bonds disposed within the packaging enclosure. Each interconnect of the plurality of interconnects is connected via a first respective wire bond of the plurality of wire bonds to the first semiconductor die and via a second respective wire bond of the plurality of wire bonds to the second semiconductor die. The plurality of interconnects includes first and second sets of interconnects extending inward from first and second opposite sides of the packaging enclosure, respectively.

In a third aspect, a method of packaging a semiconductor device includes mounting first and second semiconductor die to first and second die pads of a lead frame disposed in a lead frame sheet, respectively, connecting, with a plurality of wire bonds, each post of a plurality of posts of the lead frame to the first and second semiconductor die, each post extending inward between the first and second die pads and being connected with a respective one of a plurality of leads of the lead frame, encapsulating the first and second semiconductor die, the plurality of posts of the lead frame, and the plurality of wire bonds in a package, and shearing the lead frame sheet to define a pin for each lead of the plurality of leads. The plurality of posts includes first and second sets of posts extending inward from first and second opposite sides of the lead frame, respectively.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of packaging a semiconductor device, the method comprising:

mounting first and second semiconductor die to first and second die pads of a lead frame disposed in a lead frame sheet, respectively;

connecting, with a plurality of wire bonds, each post of a plurality of posts of the lead frame to the first and second semiconductor die, each post extending inward from opposite sides of the lead frame between the first and second die pads and being connected with a respective one of a plurality of leads of the lead frame;

encapsulating the first and second semiconductor die, the plurality of posts of the lead frame, and the plurality of wire bonds in a package; and shearing the lead frame sheet to define each lead of the plurality of leads;

wherein the plurality of posts comprises first and second sets of posts extending inward from first and second opposite sides of the lead frame, respectively.

2. The method of claim 1, wherein each post extends laterally across a line that intersects bond pads on the first and second semiconductor die to which the post is connected.

3. The method of claim 1, wherein the first and second die pads are connected to one another by a connecting bar of the lead frame that extends between the first and second die pads.

4. The method of claim 3, wherein the connecting bar has a serpentine shape.

5. The method of claim 3, wherein the connecting bar comprises a central portion oriented in parallel with the plurality of packaging posts.

6. The method of claim 1, wherein the first and second semiconductor die have layouts that are identical.

7. The method of claim 6, wherein mounting the first and second semiconductor die comprises orienting the layouts of the first and second semiconductor die 180 degrees relative to one another.

8. The method of claim 1, wherein mounting the first and second semiconductor die comprises orienting the first and second semiconductor die to position bond pads of the first and second semiconductor die for which the first and second semiconductor die share one of the plurality of leads along a respective inward facing side of the first and second semiconductor die.

9. The method of claim 1, wherein each packaging post is in contact with a respective one of the plurality of packaging leads.

10. The method of claim 1, wherein the packaging posts extending from a respective side of the first and second opposite sides are disposed in parallel.

11. The method of claim 1, wherein encapsulating the first and second semiconductor die comprises performing an overmolding procedure.

12. A method of packaging a semiconductor device, the method comprising:

mounting first and second semiconductor die to first and second die pads of a lead frame disposed in a lead frame sheet, respectively;

connecting, with a plurality of wire bonds, each post of a plurality of posts of the lead frame to the first and second semiconductor die, each post extending inward from opposite sides of the lead frame between the first and second die pads and being connected with a respective one of a plurality of leads of the lead frame;

enclosing the first and second semiconductor die, the plurality of posts of the lead frame, and the plurality of wire bonds in a package; and separating the semiconductor device from a remainder of the lead frame sheet to define each lead of the plurality of leads;

wherein the plurality of posts comprises first and second sets of posts extending inward from first and second opposite sides of the lead frame, respectively, and wherein connecting each post of the plurality of posts comprises:

connecting each post to the first semiconductor die via a first respective wire bond of the plurality of wire bonds; and connecting each post to the second semiconductor die via a second respective wire bond of the plurality of wire bonds.

13. The method of claim 12, wherein each post extends laterally across a line that intersects bond pads on the first and second semiconductor die to which the post is connected.

14. The method of claim 12, wherein the first and second die pads are connected to one another by a connecting bar of the lead frame that extends between the first and second die pads.

15. The method of claim 14, wherein the connecting bar has a serpentine shape.

16. The method of claim 14, wherein the connecting bar comprises a central portion oriented in parallel with the plurality of packaging posts.

17. The method of claim 12, wherein the first and second semiconductor die have layouts that are identical.

18. The method of claim 12, wherein mounting the first and second semiconductor die comprises orienting the layouts of the first and second semiconductor die 180 degrees relative to one another.

19. The method of claim 12, wherein mounting the first and second semiconductor die comprises orienting the first and second semiconductor die to position bond pads of the first and second semiconductor die for which the first and second semiconductor die share one of the plurality of leads along a respective inward facing side of the first and second semiconductor die.

20. The method of claim 12, wherein enclosing the first and second semiconductor die comprises performing an overmolding procedure.

* * * * *